(12) United States Patent
Du et al.

(10) Patent No.: US 11,281,098 B2
(45) Date of Patent: Mar. 22, 2022

(54) TOUCH SUBSTRATE, MANUFACTURING METHOD THEREOF AND DISPLAY APPARATUS

(71) Applicants: HEFEI XINSHENG PHOTOELECTRONICS TECHNOLOGY CO., LTD., Anhui (CN); BOE TECHNOLOGY GROUP CO., LTD., Beijing (CN)

(72) Inventors: Zhi Du, Beijing (CN); Qicheng Chen, Beijing (CN); Ming Zhang, Beijing (CN); Haifeng Hu, Beijing (CN); Liuyue Yin, Beijing (CN)

(73) Assignees: HEFEI XINSHENG PHOTOELECTRIC TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 558 days.

(21) Appl. No.: 16/333,749

(22) PCT Filed: Jun. 25, 2018

(86) PCT No.: PCT/CN2018/092629
§ 371 (c)(1),
(2) Date: Mar. 15, 2019

(87) PCT Pub. No.: WO2019/148749
PCT Pub. Date: Aug. 8, 2019

(65) Prior Publication Data
US 2021/0364914 A1     Nov. 25, 2021

(30) Foreign Application Priority Data

Feb. 5, 2018     (CN) .......................... 201810112925.3

(51) Int. Cl.
*G03F 7/00* (2006.01)
*G06F 3/041* (2006.01)
(Continued)

(52) U.S. Cl.
CPC ............ *G03F 7/0007* (2013.01); *C23C 14/14* (2013.01); *C23C 14/34* (2013.01); *G06F 3/041* (2013.01); *G06F 2203/04103* (2013.01)

(58) Field of Classification Search
CPC ....... G03F 7/0007; C23C 14/14; C23C 14/34; G06F 3/041; G06F 2203/04103
See application file for complete search history.

(56) References Cited

U.S. PATENT DOCUMENTS 9,946,406 B2 * 4/2018 Tsai ...................... G06F 3/0412
10,859,920 B2 * 12/2020 Liao .......................... G03F 1/76
(Continued)

FOREIGN PATENT DOCUMENTS

| CN | 1677626 A | 10/2005 |
| CN | 101075086 A | 11/2007 |

(Continued)

OTHER PUBLICATIONS

International Search Report dated Nov. 14, 2018, issued in counterpart Application No. PCT/CN2018/092629 (9 pages).
(Continued)

*Primary Examiner* — Vinh T Lam
(74) *Attorney, Agent, or Firm* — Westerman, Hattori, Daniels & Adrian, LLP

(57) ABSTRACT

The present discloses is related to a method for manufacturing a touch substrate. The method of manufacturing the touch substrate may include depositing a first conductive film on a base substrate; performing a first joint exposure process based on a first negative photoresist on the base substrate on which the first conductive film was deposited to
(Continued)

form a first electrode layer; forming an insulating layer on the base substrate on which the first electrode layer was formed; depositing a second conductive film on the base substrate on which the insulating layer was formed; and performing a second joint exposure process based on a second negative photoresist on the base substrate on which the second conductive film was deposited to form a second electrode layer.

17 Claims, 19 Drawing Sheets

(51) Int. Cl.
*C23C 14/34* (2006.01)
*C23C 14/14* (2006.01)

(56) References Cited

U.S. PATENT DOCUMENTS

| | | | |
|---|---|---|---|
| 2007/0287077 A1 | 12/2007 | Takushima et al. | |
| 2008/0001239 A1 | 1/2008 | Enomoto et al. | |
| 2016/0104558 A1* | 4/2016 | Chang | G06F 3/0443 216/13 |
| 2016/0170549 A1* | 6/2016 | Namkung | G06F 3/0445 345/173 |
| 2016/0202613 A1* | 7/2016 | Di | G03F 7/422 345/173 |
| 2016/0209949 A1 | 7/2016 | Jung et al. | |
| 2016/0214966 A1* | 7/2016 | Kunimoto | C07D 307/83 |
| 2016/0246402 A1* | 8/2016 | Wang | C23C 14/35 |
| 2016/0252989 A1* | 9/2016 | Zhang | G06F 3/0443 345/173 |
| 2016/0342239 A1* | 11/2016 | Xie | H05K 3/10 |
| 2016/0370624 A1* | 12/2016 | Wang | G02F 1/13439 |
| 2016/0377898 A1* | 12/2016 | Xu | G06F 3/0443 349/12 |
| 2017/0123565 A1* | 5/2017 | Li | G06F 3/0443 |
| 2017/0146867 A1* | 5/2017 | Wang | G06F 3/0412 |
| 2017/0147110 A1* | 5/2017 | Xu | G02F 1/136286 |
| 2017/0177105 A1* | 6/2017 | Wu | H05K 3/10 |
| 2017/0199596 A1* | 7/2017 | Wang | G02F 1/133512 |
| 2017/0199615 A1* | 7/2017 | Wan | H01L 27/1288 |
| 2017/0205910 A1* | 7/2017 | Liu | G02F 1/1333 |
| 2017/0205911 A1* | 7/2017 | Wang | G06F 3/044 |
| 2017/0285820 A1* | 10/2017 | Li | G06F 3/0412 |
| 2018/0175080 A1* | 6/2018 | Shi | H01L 27/124 |
| 2018/0188590 A1* | 7/2018 | Gu | G06F 3/0412 |
| 2018/0226454 A1* | 8/2018 | Liu | H01L 27/323 |
| 2018/0292926 A1* | 10/2018 | Ye | H01L 27/322 |
| 2019/0011767 A1* | 1/2019 | Yao | G03F 7/027 |
| 2019/0165327 A1* | 5/2019 | Ye | H01L 27/3244 |

FOREIGN PATENT DOCUMENTS

| | | |
|---|---|---|
| CN | 101807539 A | 8/2010 |
| CN | 104407504 A | 3/2015 |
| CN | 104869764 A | 8/2015 |
| CN | 107204309 A | 9/2017 |

OTHER PUBLICATIONS

Office Action dated Nov. 28, 2019, issued in counterpart CN application No. 201810112925.3, with English translation. (11 pages).

* cited by examiner

TOUCH SUBSTRATE, MANUFACTURING METHOD THEREOF AND DISPLAY APPARATUS

CROSS-REFERENCE TO RELATED APPLICATIONS

This application claims benefit of the filing date of Chinese Patent Application No. 201810112925.3 filed on Feb. 5, 2018, the disclosure of which is hereby incorporated in its entirety by reference.

TECHNICAL FIELD

The present disclosure relates to a display technology, in particular, to a touch substrate, a manufacturing method thereof and a display apparatus.

BACKGROUND

In order to meet requirement for large-size displays, the size of the touch panel becomes larger and larger, and the process of manufacturing the touch substrate also becomes more and more complicated. In order to increase the size of the touch substrate, a size of the mask plate needs to be increased as well. But an effective exposure area of the mask plate is always much smaller than an effective display area of the touch substrate due to exposure machine's limitation on the size of the mask plate, difficulty in manufacturing the large-size mask display, high cost, and inconvenience of daily storage and usage. In this case, multiple joint exposures of the mask plate are required to complete the manufacturing of a large size of touch substrate.

BRIEF SUMMARY

An embodiment of the present disclosure provides a method of manufacturing a touch substrate. The method of manufacturing a touch substrate may include depositing a first conductive film on a base substrate, performing a first joint exposure process based on a first negative photoresist on the base substrate on which the first conductive film was deposited to form a first electrode layer, forming an insulating layer on the base substrate on which the first electrode layer was formed, depositing a second conductive film on the base substrate on which the insulating layer was formed, and performing a second joint exposure process based on a second negative photoresist on the base substrate on which the second conductive film was deposited to form a second electrode layer.

Performing the first joint exposure process based on the first negative photoresist on the base substrate on which the first conductive film was deposited to form the first electrode layer may include depositing the first negative photoresist on the base substrate on which the first conductive film was deposited and performing a plurality of exposure processes on the base substrate on which the negative photoresist was deposited to form the first electrode layer.

The plurality of exposure processes may be performed on the base substrate on which the negative photoresist was deposited to form the first electrode layer using a first mask plate and a baffle. The first mask plate may include a light transmitting area and a non-light transmitting area, and the light transmitting area may correspond to pattern area of the first electrode layer.

Forming the insulating layer on the base substrate on which the first electrode layer was formed may include depositing a positive photoresist on the base substrate on which the first electrode layer was formed and performing a plurality of exposure processes on the base substrate on which the positive photoresist was deposited to form the insulating layer.

Performing the second joint exposure process based on the second negative photoresist on the base substrate on which the second conductive film was deposited to form the second electrode layer may include depositing the second negative photoresist on the base substrate on which the second conductive film was formed and performing a plurality of exposure processes on the base substrate on which the second negative photoresist was deposited to form the second electrode layer. The plurality of exposure processes may be performed on the base substrate on which the second negative photoresist was deposited to form the second electrode layer using a third mask plate and a baffle. The third mask plate may include a light transmitting area and a non-light transmitting area, and the light transmitting area corresponds to pattern area of the second electrode layer.

The method of manufacturing a touch substrate may further include depositing a positive photoresist on the base substrate on which the second electrode layer was formed and performing a plurality of exposure processes on the base substrate on which the positive photoresist was deposited to form a protective layer.

During each of the first and second joint exposure processes, a width of a repeated exposure area may be about 3 µm. The first joint exposure process forming the first electrode layer may use a first mask pattern, the plurality of exposure processes forming the insulating layer may use a second mask pattern, and the first mask pattern and the second mask pattern may be located on a same mask plate. The second joint exposure process forming the second electrode layer may use a third mask pattern, the plurality of exposure processes forming the protective layer may use a fourth mask pattern, and the third mask pattern and the fourth mask pattern may be located on a same mask plate.

Depositing the first conductive film on the base substrate may include forming a light-shielding layer on the base substrate and depositing the first conductive film on the base substrate on which the light-shielding layer was formed by sputtering deposition. The first conductive film may be made of aluminum or copper.

Forming the light-shielding layer on the base substrate may include forming a light-shielding film on the substrate and performing joint exposure, developing and baking processes on the base substrate coated with the light-shielding film to form the light-shielding layer.

Another example of the present disclosure is a touch substrate manufactured by the method according to one embodiment of the present disclosure.

Another example of the present disclosure is a display apparatus comprising the touch substrate according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
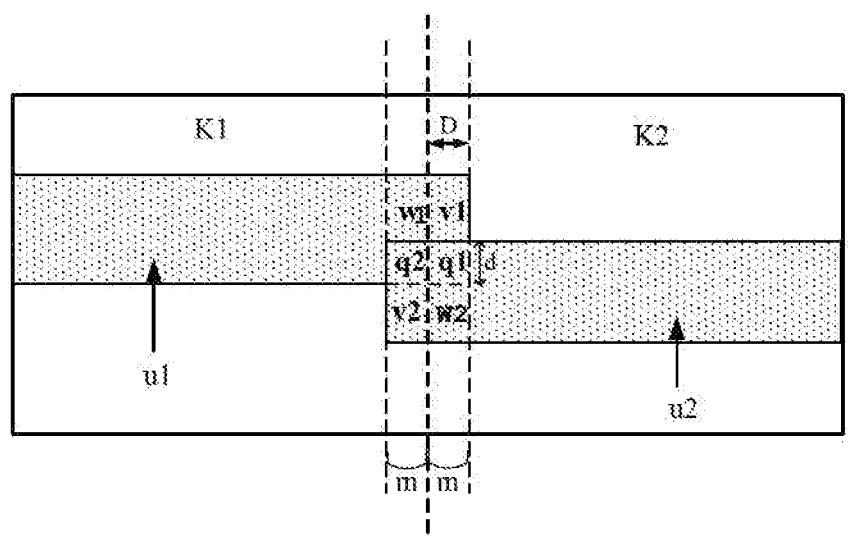
FIG. 1 shows a schematic diagram of forming an electrode layer in the related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-19. When referring to the figures, like structures and elements shown throughout are indicated with like reference numerals.

At present, when the joint exposure is performed, a large size of touch substrate can be divided into a plurality of regions. The respective regions are then exposed in sequence using a mask plate and a baffle, thereby obtaining the large size of touch substrate. There are repeated exposure areas in the process. The repeated exposure area is located at the junction of two adjacent regions. The repeated exposure area includes a joint area, which is an overlapping area of two adjacent patterns in two adjacent regions.

In the manufacturing of a touch substrate in the related art, a positive photoresist and a corresponding mask plate are currently used for multiple joint exposures to fabricate an electrode layer. However, the above method has some shortcomings. For example, when an electrode layer is manufactured, a width of a joint area can be very small. Accordingly, joint mura phenomenon tends to occur, thereby decreasing display effect of the touch panel.

The present disclosure first provides a brief description of joint mura phenomenon that occurs in the process of manufacturing an electrode layer in related art. In the related art, a positive photoresist is used, and a base substrate on which a conductive thin film is deposited is subjected to a joint exposure process to form the electrode layer.

FIG. 1 exemplarily shows a top view of forming an electrode layer in the related art. As shown in FIG. 1, before the joint exposure is performed, a positive photoresist is coated on a base substrate on which a conductive thin film was deposited. Then, the base substrate is divided into two regions: K1 and K2. Then, the positive photoresist in region K1 is exposed using a mask plate to obtain an electrode pattern u1. The positive photoresist in region K2 is exposed using a mask plate to obtain an electrode pattern u2. During the actual exposure process, due to a certain amount of error in alignment accuracy of the exposure machine, it is necessary to reserve a certain width of repeated exposure area between the two regions in order to ensure integrity of the electrode patterns.

For example, due to the characteristics the positive photoresist being removed in the area where it is exposed, when the K1 region is exposed, a baffle should be designed above the mask to block the K2 region and prevent the K2 region from being exposed to the light. The width of the corresponding repeated exposure area is 2 m. During the formation of the electrode pattern u1, the areas W1, V1, Q1, and Q2 are not exposed. During the formation of the electrode pattern u2, the areas W2, V2, Q1, and Q2 are not exposed. Since the positive photoresist will be removed in the area where it is exposed and maintained where it is not exposed, the final remaining areas where the photoresists are maintained are Q1+Q2, resulting in a final line width that is thinner than other areas. During the entire exposure process, the positive photoresist in the exposure region v1 and the exposure region w1 is not exposed in the formation of the electrode pattern u1, but is exposed in the formation of the electrode pattern u2. As such, the electrode patterns in the exposure area v1 and the exposure area w1 are removed when the following developing and etching processes are performed. Since the alignment accuracy of the exposure machine always has a certain error, the width d of the joint are q1 (or the joint area q2) may be too small. The smaller the width of the joint area, the larger the areas of the exposure area v1 and the exposure area w1, and accordingly the larger the areas of the corresponding electrode patterns to be removed. As such, joint mura phenomenon tends to occur.

Figure 2:
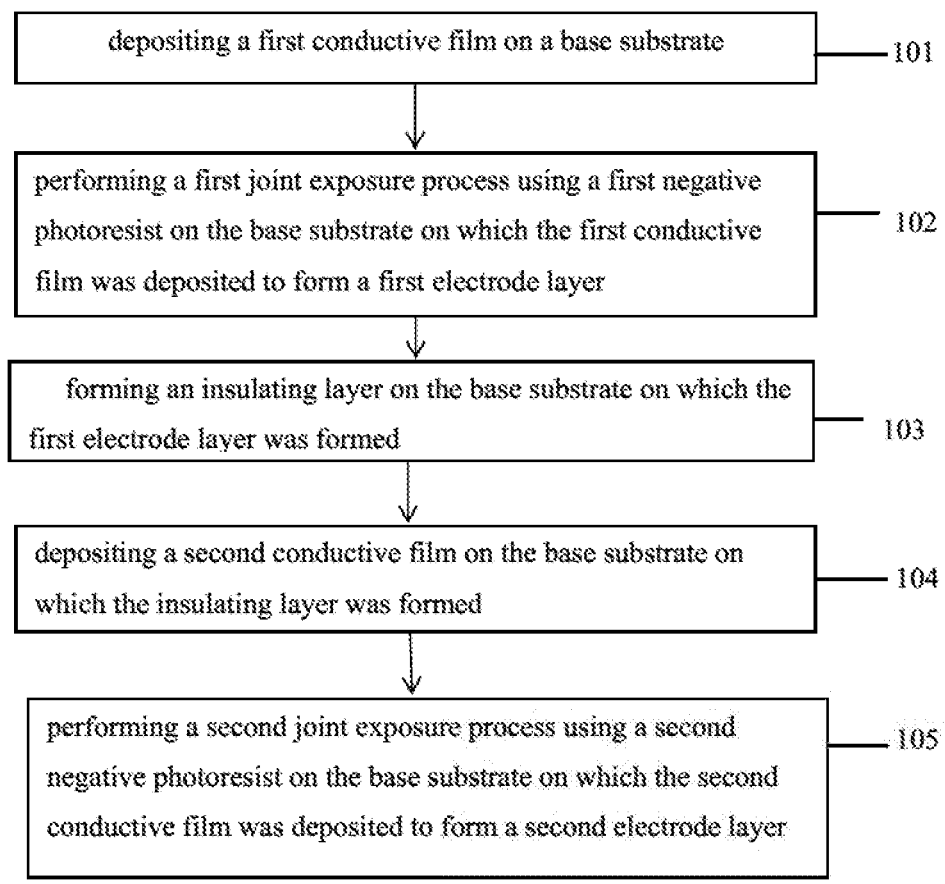
FIG. 2 is a flowchart of a method of manufacturing a touch substrate according to an embodiment of the present disclosure.

One embodiment of the present disclosure provides a method for manufacturing a touch substrate. As shown in FIG. 2, the method includes the following:

In step 101, a first conductive thin film is deposited on a base substrate.

In step 102, a joint exposure process based on a negative photoresist is performed on the base substrate on which the first conductive thin film was deposited to form a first electrode layer.

In step 103, an insulating layer is formed on the base substrate on which the first electrode layer was formed.

In step 104, a second conductive film is deposited on the base substrate on which the insulating layer was formed.

In step 105, a joint exposure process based on a negative photoresist is performed on the base substrate on which the second conductive thin film was deposited to form a second electrode layer.

The embodiment of the present disclosure provides a method for manufacturing a touch substrate. During the method, a base substrate on which a first conductive thin film was deposited is subjected to a joint exposure process based on a negative photoresist to form a first electrode layer. Furthermore, a joint exposure process based on a negative photoresist is performed on the base substrate on which a second conductive thin film was deposited to form a second electrode layer. Compared with those in the related art, the joint mura phenomenon caused by small width of the joint area is significantly reduced when the electrode layers are formed in the embodiment of the present disclosure, thereby improving display effect of the touch panel.

In the embodiment of the present disclosure, a base substrate on which the conductive thin film was deposited is subjected to a joint exposure process based on a negative photoresist to form an electrode layer. The process of forming the electrode layer in the embodiment of the present disclosure will now be described with reference to FIG. 1 as an example.

As shown in FIG. 1, before the joint exposure, a negative photoresist is costed on a base substrate on which a conductive thin film was deposited, and then the base substrate is divided into two regions: K1 and K2. Then, the negative photoresist in region K1 is exposed using a mask plate to obtain an electrode pattern u1. The negative photoresist in region K2 is exposed using a mask plate to obtain an electrode pattern u2. The width of the corresponding repeated exposure area is 2 m.

During the formation of the electrode pattern u1, the areas W1, V1, Q1, and Q2 are exposed. During the formation of the electrode pattern u2, the areas W2, V2, Q1, and Q2 are exposed. Since the negative photoresist will be maintained in the area where it is exposed and removed where it is not exposed, the final remaining areas where the photoresist are maintained are W1+V1+Q1+Q2+V2+W2, resulting in a final line width that is wider than other areas.

At the same time, due to the characteristics of the negative photoresist being maintained in the area where it is exposed, the mask needs to transmit light only in the area where the pattern needs to be maintained. The remaining area of the mask could be opaque. Therefore, when the K1 region is exposed, there is no need to provide a baffle.

During the entire exposure process, the negative photoresist in the exposure region v1 and the exposure region w1 is exposed during the formation of the electrode pattern u1 and is not affected during the formation of the electrode pattern u2. Thus, when the developing and etching processes are performed, the electrode pattern u2 in the exposure area v1 and the exposure area w1 are not removed. Therefore, even when the width d of the joint area is small, joint mura phenomenon is unlikely to occur, and accordingly the joint mura phenomenon can be significantly reduced.

Figure 3:
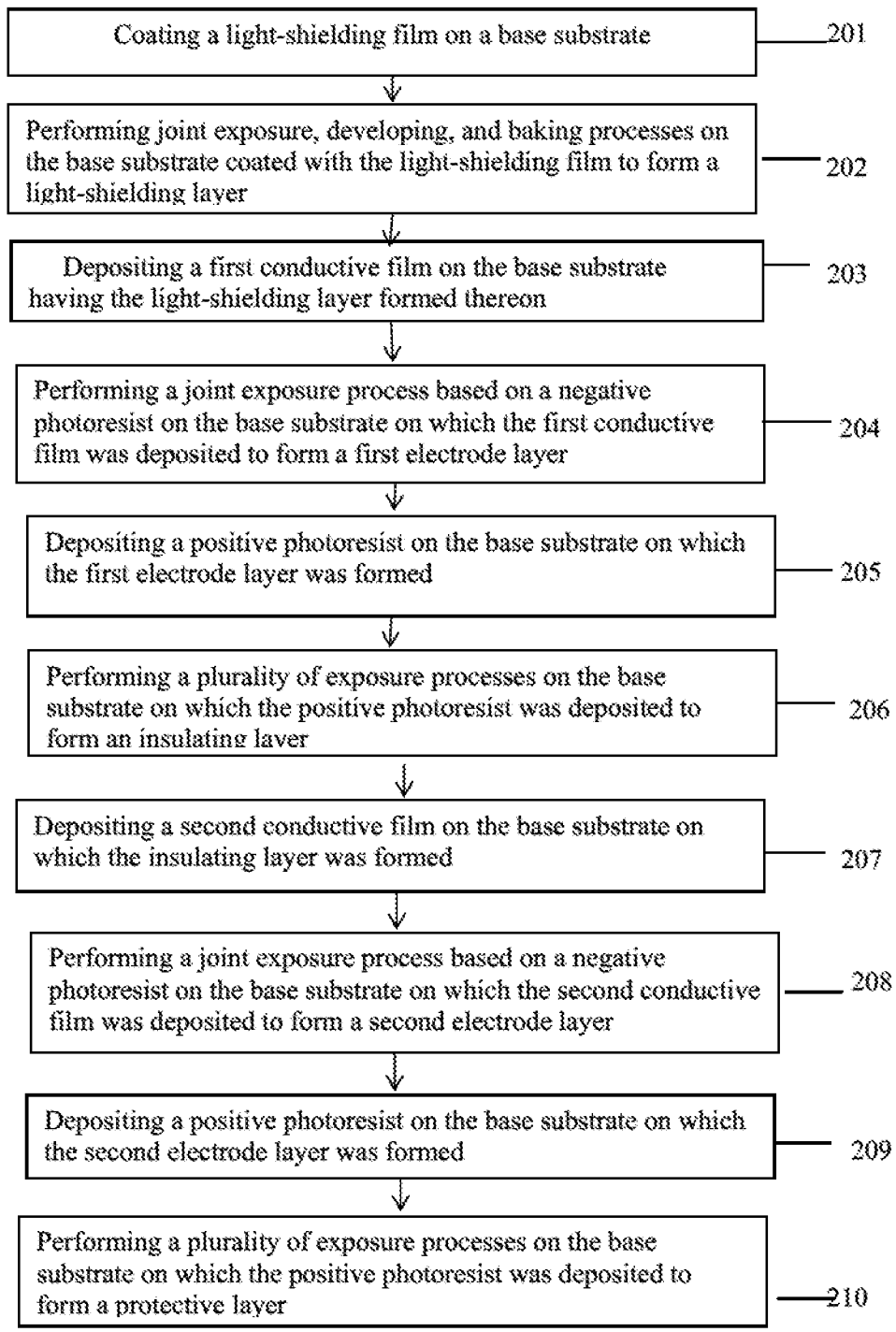
FIG. 3 is a flowchart of a method of manufacturing a touch substrate according to an embodiment of the present disclosure.

An embodiment of the present disclosure provides another method for manufacturing a touch substrate. As shown in FIG. 3, the method includes the following:

In step 201, a light-shielding film is coated on a base substrate.

Figure 4:
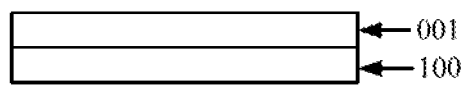
FIG. 4 is a schematic structural diagram of forming a light-shielding film on a base substrate according to an embodiment of the present disclosure.

As shown in FIG. 4, a light-shielding film 001 is coated on a base substrate 100. The material of the light-shielding film is a negative photoresist. FIG. 4 is a side view of the light-shielding film coated on the base substrate.

In step 202, joint exposure, developing, and baking processes are performed on the base substrate coated with the light-shielding film to form a light-shielding layer.

Figure 5:
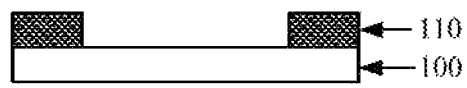
FIG. 5 is a schematic structural diagram of forming a light-shielding layer according to an embodiment of the present disclosure.

As shown in FIG. 4, the base substrate 100 coated with the light-shielding film is subjected to joint exposure, developing and baking processes to form the light-shielding layer 110. FIG. 5 shows a side view of the light-shielding layer.

The base substrate coated with the light-shielding film is divided into a plurality of regions, and the joint exposure means that the respective regions are exposed in sequence using a mask plate corresponding to the light-shielding layer and a baffle plate.

Figure 6:
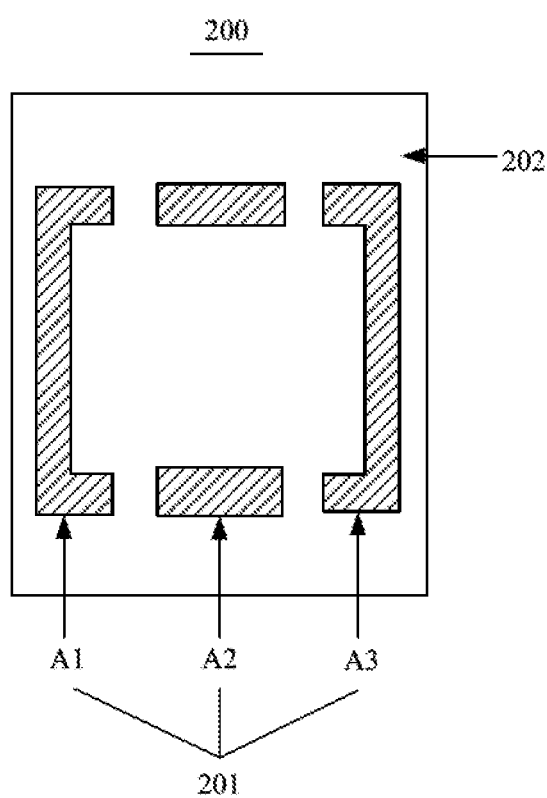
FIG. 6 is a schematic structural diagram of a mask plate corresponding to a light-shielding layer according to an embodiment of the present disclosure.

For example, as shown in FIG. 6, a mask plate 200 corresponding to the light-shielding layer includes a light transmitting area 201 and a non-light transmitting area 202. The light transmitting area 201 corresponds to the pattern area of the light-shielding layer, and the light transmitting area 201 includes area A1, area A2 and area A3. FIG. 6 is a top view of the mask plate 200.

Figure 7:
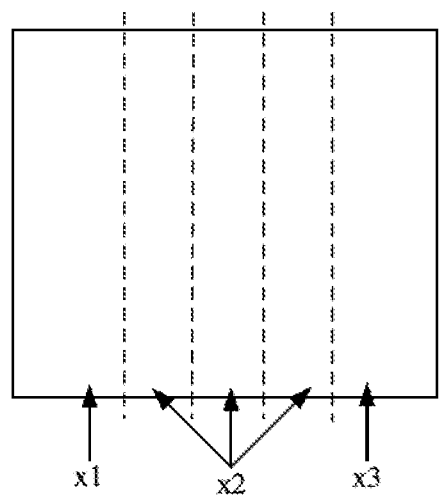
FIG. 7 is a schematic structural diagram of a base substrate coated with a light-shielding film being divided into a plurality of regions according to an embodiment of the present disclosure.

During the joint exposure, the base substrate coated with the light-shielding film may be first divided into a plurality of regions. As shown in FIG. 7, the plurality of regions includes a region x1, a plurality of regions x2, and a region x3. After that, each region in FIG. 7 is sequentially exposed using a baffle plate and the mask plate shown in FIG. 6. When a certain area in the light transmitting area of the mask plate is used for exposure, the remaining areas of the light transmitting area are blocked by the baffle. For example, when area A1 in the light transmitting area is exposed, area A2 and area A3 are blocked by the baffle plate. FIG. 7 illustrates a top view of the base substrate coated with the light-shielding film being divided into a plurality of regions.

In one embodiment, the baffle plate is set on the exposure machine. In the practical application, there is a certain error in the alignment accuracy of the exposure machine. Thus, it is necessary to reserve a certain width of the repeated exposure area between two adjacent regions. For example, as shown in FIG. 1, the width d of the set repeated exposure area m may be 3 μm.

Figure 8:
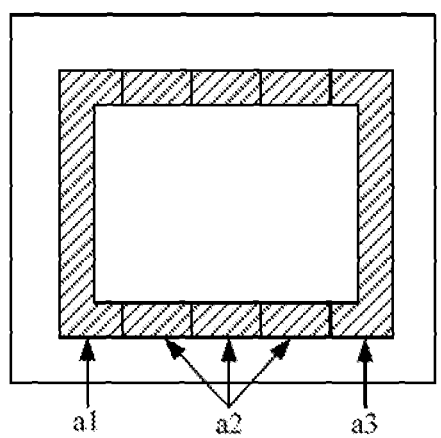
FIG. 8 is a schematic structural diagram of forming a light-shielding layer pattern on a base substrate coated with a light-shielding film according to an embodiment of the present disclosure.

Taking FIG. 6 and FIG. 7 as an example, the joint exposure process will be described. In one embodiment, In order to expose the region x1 in FIG. 7 using the mask area A1 shown in FIG. 6, the area A2 and the area A3 of the mask plate are first covered by the baffle of the exposure machine. Then, the exposure machine is turned on and exposes the region x1 in FIG. 7 by the area A1. Thereafter, regions x2 and x3 in FIG. 7 are exposed in the similar way. As such, the light-shielding layer patterns a1, a2 and a3 shown in FIG. 8 are formed. FIG. 8 is a top view of the formed light-shielding layer patterns.

After the joint exposure is performed, the base substrate coated with the light-shielding film is further developed and baked to form the light-shielding layer.

In step 203, a first conductive film is deposited by a sputtering deposition method on the base substrate having the light-shielding layer formed thereon.

Figure 9:
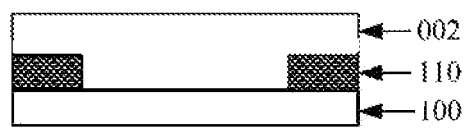
FIG. 9 is a schematic structural diagram of depositing a first conductive film on a base substrate having a light-shielding layer according to an embodiment of the present disclosure.

As shown in FIG. 9, a first conductive thin film 002 is deposited by sputtering deposition on the base substrate 100 on which the light-shielding layer 110 was formed, FIG. is a side view of the deposited first conductive thin film.

In one embodiment, the first conductive film is made of aluminum or copper.

In one embodiment, the first conductive film may also be deposited by coating on the base substrate on which the light-shielding layer was formed.

In step 204, a joint exposure process based on a negative photoresist is performed on the base substrate on which the first conductive film was deposited to form a first electrode layer.

Figure 10:
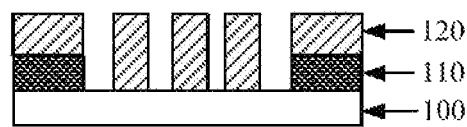
FIG. 10 is a schematic structural diagram of forming a first electrode layer according to an embodiment of the present disclosure.

As shown in FIG. 9, a joint exposure process based on a negative photoresist is performed on the base substrate 100 on which the first conductive film 002 was deposited to form a first electrode layer 120. FIG. 10 shows a side view of formation of the first electrode.

Specifically, step 204 may include applying a negative photoresist on the base substrate on which the first conductive film was deposited; performing a joint exposure using a first mask plate; developing, etching, and stripping the coated negative photoresist to obtain the first electrode layer.

Figure 11:
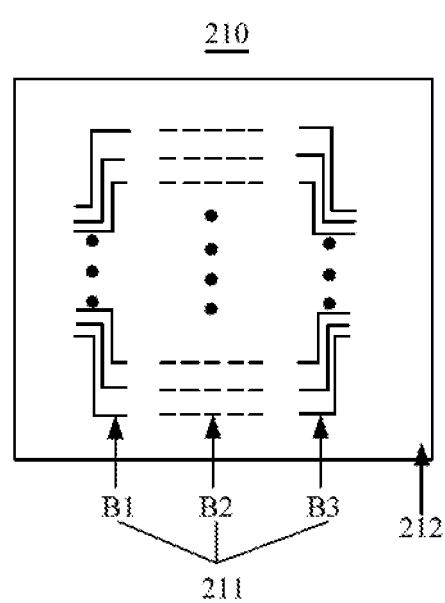
FIG. 11 is a schematic structural diagram of a first mask plate according to an embodiment of the present disclosure.

In one embodiment, FIG. 11 shows a top view of the first mask plate 210. The first mask plate 210 includes a first light transmitting area 211 and a first non-light transmitting area 212. The first light transmitting area corresponds to the pattern area of the first electrode layer. The first light transmitting area 211 includes area B1, area B2, and area B3.

When the joint exposure is performed, the base substrate on which the first conductive film was deposited may be divided into a plurality of regions including a region y1, a plurality of regions y2, and a region y3. There is a repeated exposure area between two adjacent regions. For example, during the joint exposure process, the width of the reserved repeated exposure area may be about 3 µm.

Figure 12:
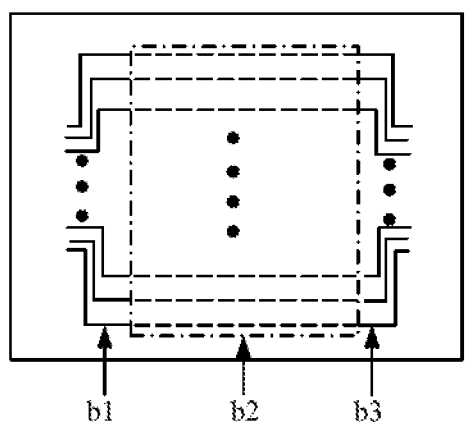
FIG. 12 is a schematic structural diagram of forming an electrode layer on a base substrate on which a thin conductive film was deposited according to an embodiment of the present disclosure.

Now taking FIG. 11 as an example to illustrate the joint exposure process, in order to expose the region y1 of the base substrate on which the first conductive thin film was formed using a mask area B1 shown in FIG. 11, the mask area B2 and area B3 are first covered by the baffle on the exposure machine. Then, the exposure machine is turned on, and then uses the mask area B1 to expose region y1 of the base substrate on which the first conductive thin film was deposited. Thereafter, region y2 and region y3 of the base substrate on which the first conductive thin film was deposited are exposed in the similar way. Finally, electrode patterns b1, b2 and 63 as shown in FIG. 12 are formed. FIG. 12 is a top view of the formed electrode patterns.

In order to reduce the joint mura phenomenon caused by the width of the joint area being too small, the related art employs a shielding strip on the mask plate. The position of the shielding strip corresponds to the position of the repeated exposure area. The small area of electrode patterns in exposed area v1 and exposed area w as shown in FIG. 1 can be removed by using the shielding strip. However, such a mask plate broadens line width of the edge area of the electrode patterns, and eventually causes difficulty in adjusting electrical properties of the touch substrate.

In the embodiment of the present disclosure, the base substrate on which the first conductive film was deposited is subjected to a joint exposure process based on a negative photoresist and the first mask plate to form the first electrode layer. Compared to the related art, the joint mura phenomenon caused by the small width of the joint area can be significantly reduced, thereby improving the display effect of the touch panel. In addition, because the first mask plate is not provided with a shielding strip, the line width of the edge area of the electrode patterns does not become broad, thereby overcoming the problem that it is difficult to adjust the electrical performance of the touch substrate in the related art.

In step 205, a positive photoresist is deposited on the base substrate on which the first electrode layer was formed.

Figure 13:
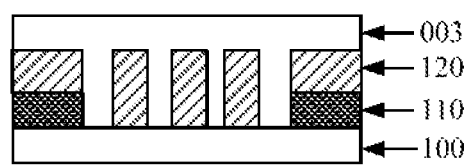
FIG. 13 is a schematic structural diagram of depositing a positive photoresist on a base substrate on which a first electrode layer was formed according to an embodiment of the present disclosure.

As shown in FIG. 13, a positive photoresist 003 is deposited on the base substrate 100 on which the first electrode layer 120 was formed. In one embodiment, a positive photoresist may be deposited on the base substrate on which the first electrode layer was formed by a coating method. FIG. 13 is a side view of a positive photoresist deposited on the base substrate on which the first electrode layer was formed.

In step 206, a plurality of exposure processes is performed on the base substrate on which the positive photoresist was deposited to form an insulating layer.

Figure 14:
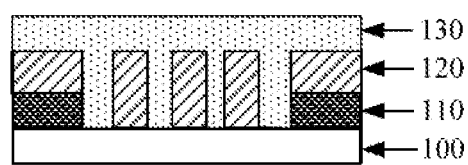
FIG. 14 is a schematic structural diagram of an insulating layer according to an embodiment of the present disclosure.

As shown in FIG. 13, the base substrate 100 on which the positive photoresist was deposited is subjected to an exposure process multiple times to form an insulating layer 130. As shown in FIG. 14, FIG. 14 is a side view of the formed insulating layer.

In the embodiment of the present disclosure, after the positive photoresist is deposited on the base substrate on which the first electrode layer was formed, a second mask plate is used to preform a plurality of exposure processes on the base substrate on which the positive photoresist was deposited to form the insulating layer.

Figure 15:
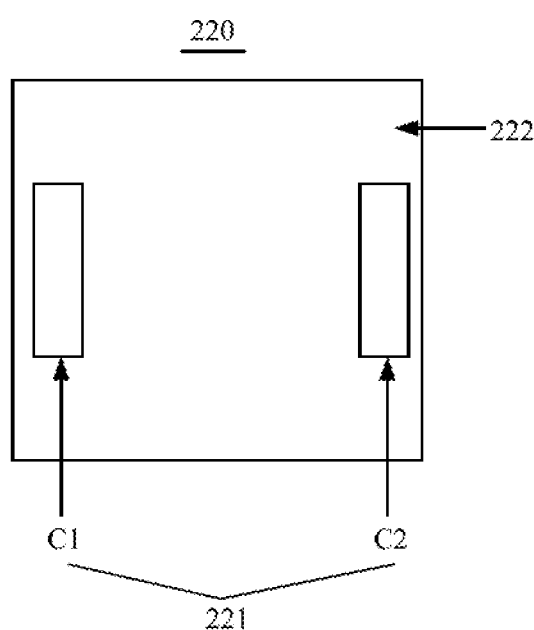
FIG. 15 is a schematic structural diagram of a second mask plate according to an embodiment of the present disclosure.

In one embodiment, FIG. 15 shows a top view of the second mask plate 220. The second mask plate 220 includes a second light transmitting area 221 and a second non-light transmitting area 222. The second non-light transmitting area 222 corresponds to the pattern area of the insulating layer, and the second light transmitting area 221 includes area C1 and area C2.

During the exposure process, binding region z1 and binding region z2 can be formed first. Since the positive photoresist is used, the second light transmitting area 221 of the second mask plate shown in FIG. 15 can be used to expose the binding regions z1 and z2 one time respectively.

Figure 16:
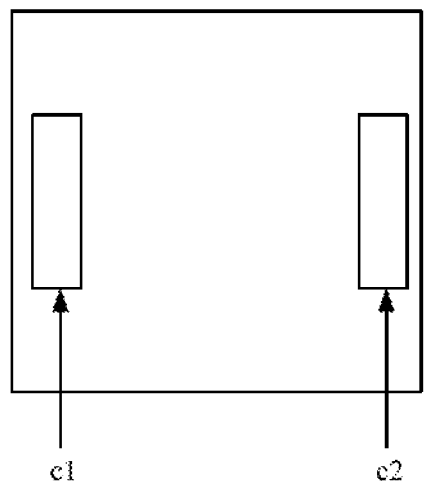
FIG. 16 is a schematic structural diagram of forming a binding area pattern on a base substrate on which a positive photoresist was deposited according to an embodiment of the present disclosure.

In one embodiment, as shown in FIG. 15, in order to use the area C1 of the mask plate 15 shown in FIG. 15 to expose the bonding region z1, mask region C2 is first blocked by the baffle on the exposure machine. Then, the exposure machine is turned on, and the binding region z1 is exposed through the area C1. Thereafter, the binding region z2 is exposed in the similar manner, and the insulating layer is finally formed as shown in FIG. 16. The area c1 in FIG. 16 corresponds to binding region z1, and the area c2 corresponds to binding region z2. FIG. 16 is a top view of the formed insulating layer.

After the plurality of exposure processes is performed on the base substrate on which the positive photoresist was deposited, the base substrate is developed and baked to form the insulating layer.

In the related art, a negative photoresist is deposited on a base substrate having a first electrode layer formed thereon, and then a plurality of exposure processes is performed on the base substrate on which the negative photoresist was deposited to form an insulating layer. Since a negative photoresist is used, it is necessary to expose all areas other than the binding area z1 and the binding area z2 on the base substrate. As such, there is a large repeated exposure area, and accordingly joint mum phenomenon is likely to occur. In the embodiment of the present disclosure, since a positive photoresist is deposited on the base substrate on which a first electrode layer was formed, so when a plurality of exposure processes is performed on the base substrate on which the positive photoresist was deposited, it is only necessary for the binding regions z1 and z2 to be exposed once respectively to form an insulating layer. Compared to the related art, them are no large repeated exposed areas. Accordingly, joint mura phenomenon is significantly reduced, thereby improving the display effect of the touch panel.

Figure 17:
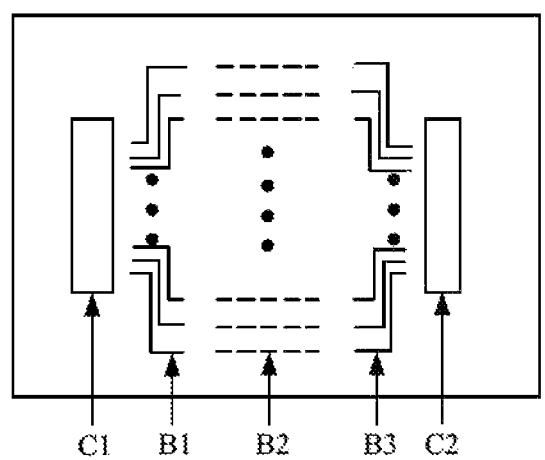
FIG. 17 is a schematic structural diagram of a mask plate containing a first mask pattern and a second mask pattern according to an embodiment of the present disclosure.

In one embodiment of the present disclosure, the pattern of the mask plate used (the first mask plate shown in FIG. 11) during the joint exposure process to form the first electrode layer is the first mask pattern. The pattern of the mask plate used (the second mask plate shown in FIG. 15) during the plurality of exposure processes to form the insulating layer is the second mask pattern. The first mask pattern and the second mask pattern may be located on the same mask plate, as shown in FIG. 17. FIG. 17 shows a top view of a mask plate containing both the first mask pattern and the second mask pattern. Since the first mask pattern and the second mask pattern are located on the same mask plate, one mask plate can be saved, thereby reducing the manufacturing cost.

In step 207, a second conductive film is deposited on the base substrate on which the insulating layer was formed.

In one embodiment, step 207 may include depositing a second conductive film on the base substrate formed with the insulating layer by sputter deposition.

In step 208, a joint exposure process based on a negative photoresist is performed on the base substrate on which the second conductive film was deposited to form a second electrode layer.

Figure 18:
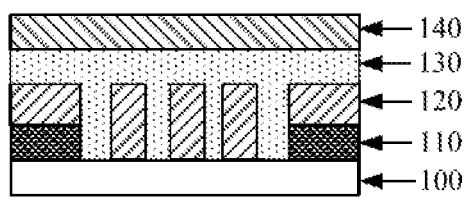
FIG. 18 is a schematic structural diagram of forming a second electrode layer according to an embodiment of the present disclosure.

As shown in FIG. 18, the base substrate 100 on which the second conductive film was deposited is subjected to a joint exposure process based on the negative photoresist to form the second electrode layer 140. FIG. 18 is a side view of the formed second electrode layer.

In one embodiment, step 208 may include applying a negative photoresist on the base substrate on which the second conductive film was deposited; performing a joint exposure on the coated negative photoresist using a third mask plate; developing, engraving and striping the negative photoresist to obtain the second electrode layer. In one embodiment, the third mask plate includes a light transmitting area and a non-light transmitting area, and the light transmitting area corresponds to the pattern area of the second electrode layer.

In the embodiment of the present disclosure, since a joint exposure process is performed on the base substrate on which the second conductive film was deposited using the negative photoresist and the third mask to form the second electrode layer, compared to the related art, joint mura phenomenon caused by the small width of the joint area can be significantly reduced, thereby improving the display effect of the touch panel. In addition, because the third mask plate does not have a shielding strip, the line width of the edge area of the electrode patterns does not increase, thereby overcoming the difficulty to adjust the electrical performance of the touch substrate in the related art.

In step 209, a positive photoresist is deposited on the base substrate on which the second electrode layer was formed.

In one embodiment, a positive photoresist may be deposited on the base substrate on which the first electrode layer was formed by a coating method.

In step 210, a plurality of exposure processes is performed on the base substrate on which the positive photoresist was deposited to form a protective layer.

Figure 19:
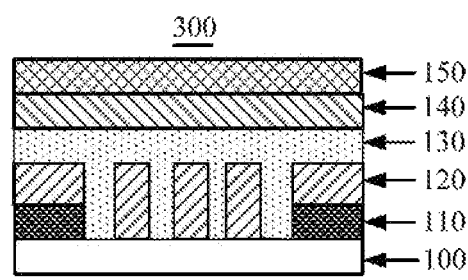
FIG. 19 is a schematic structural diagram of forming a protective layer according to an embodiment of the present disclosure.

As shown in FIG. 19, a plurality of exposure processes is performed on the base substrate 100 on which the positive photoresist was deposited to form the protective layer 150. FIG. 19 is a side view of the protective layer formed.

In one embodiment of the present disclosure, after a positive photoresist is deposited on the base substrate having the second electrode layer formed thereon, a fourth mask plate is used to perform a plurality of exposure processes on the base substrate having the positive photoresist deposited thereon to form a protective layer. In one embodiment, the fourth mask plate includes a light transmitting area and a non-light transmitting area, and the non-light transmitting area corresponds to the pattern area of the protective layer.

After the plurality of exposure processes is performed on the base substrate on which the positive photoresist was deposited, the base substrate is developed and baked to form the protective layer.

In the embodiment of the present disclosure, since a positive photoresist is deposited on the base substrate on which the second electrode layer was formed, when a plurality of exposure processes is performed on the base substrate on which the positive photoresist was deposited, the area corresponding to the light transmitting area in the fourth mask plate can be exposed to form a protective layer. Since there is no need to expose the area other than the area corresponding to the light transmitting area in the fourth mask plate, there are no large repeated exposure areas. As such, the joint mura phenomenon is significantly reduced, thereby improving the display effect of the touch panel.

In one embodiment, the mask pattern of the mask plate used (i.e., the third mask plate in step 208) in the repeated exposure process to form the second electrode layer is the third mask pattern, and the mask pattern of the mask plate used (i.e., the fourth mask plate in step 210) in the plurality of exposure processes to form the protective layer is the fourth mask pattern. The third mask pattern and the fourth mask pattern are located on the same mask plate. As such, it is also possible to save one mask plate and further reduce the manufacturing cost.

It also should be noted that the sequence of the steps of the method for manufacturing the touch substrate provided by the embodiment of the present disclosure can be adjusted appropriately, and the steps can also be increased or decreased according to the situation. Any alternative methods that can easily be envisaged by a person skilled in the art should all be covered by the scope of protection of the present disclosure and will not be described in detail herein.

The embodiments of the present disclosure provide a method for manufacturing a touch substrate. Because a negative photoresist is used, a base substrate on which a first conductive film was deposited is subjected to a joint exposure process based on the negative photoresist to form a first electrode layer. The base substrate on which a second conductive film was deposited is subjected to a joint exposure process based on a negative photoresist to form a second electrode layer. Compared with the related art, during the formation of the electrode layers, the joint mura phenomenon caused by the small width of the joint area is reduced, thereby improving the display effect of the touch panel and overcoming the problem that it is difficult to adjust the electrical performance of the touch substrate in the related art. At the same time, in the processes of manufacturing the insulating layer and the protective layer, there is no large repeated exposure area, thereby reducing the joint mura phenomenon. In addition, two masks can be saved to reduce costs.

An embodiment of the present disclosure provides a touch substrate 300, as shown in FIG. 19. In one embodiment, the touch substrate is a touch substrate manufactured by the method shown in FIG. 2 or 3. Because a negative photoresist is used, a base substrate on which a first conductive film was deposited is subjected to a joint exposure process to form a first electrode layer. Furthermore, based on a negative photoresist, the base substrate on which a second conductive film was deposited is subjected to a joint exposure process to form a second electrode layer. Compared with the related at, during the formation of the electrode layers, the joint mum phenomenon caused by the small width of the joint area is significantly reduced, thereby improving the display effect of the touch panel and overcoming the problem that it is difficult to adjust the electrical performance of the touch substrate in the related art. At the same time, in the processes of manufacturing the insulating layer and the protective layer, there is no large repeated exposure area, thereby reducing the joint mura phenomenon. In addition, two mask plates can be saved to further reduce costs.

An embodiment of the present disclosure provides a display apparatus, which including the touch substrate in the above embodiment. The display apparatus can be any product or component with display function such as electronic paper, mobile phone, tablet computer, television, monitor, laptop, digital photo frame, navigator, and the like.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A method of manufacturing a touch substrate, comprising:
   depositing a first conductive film on a base substrate;
   performing a first joint exposure process based on a first negative photoresist on the base substrate on which the first conductive film was deposited to form a first electrode layer;
   forming an insulating layer on the base substrate on which the first electrode layer was formed;
   depositing a second conductive film on the base substrate on which the insulating layer was formed; and
   performing a second joint exposure process based on a second negative photoresist on the base substrate on which the second conductive film was deposited to form a second electrode layer.

2. The method according to claim 1, wherein performing the first joint exposure process based on the first negative photoresist on the base substrate on which the first conductive film was deposited to form the first electrode layer comprises:
   depositing the first negative photoresist on the base substrate on which the first conductive film was deposited; and
   performing a plurality of exposure processes on the base substrate on which the negative photoresist was deposited to form the first electrode layer.

3. The method according to claim 2, wherein the plurality of exposure processes is performed on the base substrate on which the negative photoresist was deposited to form the first electrode layer using a first mask plate and a baffle.

4. The method according to claim 3, wherein the first mask plate comprises a light transmitting area and a non-light transmitting area, and the light transmitting area corresponds to pattern area of the first electrode layer.

5. The method according to claim 4, wherein forming the insulating layer on the base substrate on which the first electrode layer was formed comprises:
   depositing a positive photoresist on the base substrate on which the first electrode layer was formed; and
   performing a plurality of exposure processes on the base substrate on which the positive photoresist was deposited to form the insulating layer.

6. The method according to claim 1, wherein performing the second joint exposure process based on the second negative photoresist on the base substrate on which the second conductive film was deposited to form the second electrode layer comprises:
   depositing the second negative photoresist on the base substrate on which the second conductive film was formed; and
   performing a plurality of exposure processes on the base substrate on which the second negative photoresist was deposited to form the second electrode layer.

7. The method according to claim 6, wherein the plurality of exposure processes is performed on the base substrate on which the second negative photoresist was deposited to form the second electrode layer using a third mask plate and a baffle.

8. The method according to claim 7, wherein the third mask plate comprises a light transmitting area and a non-light transmitting area, and the light transmitting area corresponds to pattern area of the second electrode layer.

9. The method according to claim 1, further comprising:
   depositing a positive photoresist on the base substrate on which the second electrode layer was formed; and
   performing a plurality of exposure processes on the base substrate on which the positive photoresist was deposited to form a protective layer.

10. The method according to claim 1, wherein during each of the first and second joint exposure processes, a width of a repeated exposure area is about 3 μm.

11. The method according to claim 5, wherein the first joint exposure process forming the first electrode layer uses a first mask pattern, the plurality of exposure processes forming the insulating layer uses a second mask pattern, and the first mask pattern and the second mask pattern are located on a same mask plate.

12. The method according to claim 9, wherein the second joint exposure process forming the second electrode layer uses a third mask pattern, the plurality of exposure processes forming the protective layer uses a fourth mask pattern, and the third mask pattern and the fourth mask pattern are located on a same mask plate.

13. The method according to claim 1, wherein depositing the first conductive film on the base substrate comprises:
   forming a light-shielding layer on the base substrate; and
   depositing the first conductive film on the base substrate on which the light-shielding layer was formed by sputtering deposition.

14. The method according to claim 13, wherein the first conductive film is made of aluminum or copper.

15. The method according to claim 13, wherein forming the light-shielding layer on the base substrate comprises:
 forming a light-shielding film on the substrate; and
 performing joint exposure, developing and baking processes on the base substrate coated with the light-shielding film to form the light-shielding layer.

16. A touch substrate manufactured by the method according to claim 1.

17. A display apparatus comprising the touch substrate according to claim 16.

* * * * *